United States Patent
Hamaguchi

(10) Patent No.: US 7,485,239 B2
(45) Date of Patent: Feb. 3, 2009

(54) COMPONENT OF GLASS-LIKE CARBON FOR CVD APPARATUS AND PROCESS FOR PRODUCTION THEREOF

(75) Inventor: Maki Hamaguchi, Kobe (JP)

(73) Assignee: Kobe Steel, Ltd, Kobe-shi (JP)

( * ) Notice: Subject to any disclaimer, the term of this patent is extended or adjusted under 35 U.S.C. 154(b) by 230 days.

(21) Appl. No.: 11/493,518

(22) Filed: Jul. 27, 2006

(65) Prior Publication Data

US 2006/0261039 A1 Nov. 23, 2006

Related U.S. Application Data

(62) Division of application No. 10/631,790, filed on Aug. 1, 2003, now abandoned.

(30) Foreign Application Priority Data

| Aug. 6, 2002 | (JP) | ............................ 2002-229012 |
| May 15, 2003 | (JP) | ............................ 2003-137820 |

(51) Int. Cl.
  *B44C 1/22* (2006.01)
  *B31D 3/00* (2006.01)
  *C01B 31/00* (2006.01)

(52) U.S. Cl. .................... 216/52; 264/29.1; 216/53; 216/56

(58) Field of Classification Search ............. 216/56, 216/52, 53; 264/29.1, 29.6, 29.7, 632; 428/408
See application file for complete search history.

(56) References Cited

U.S. PATENT DOCUMENTS

| 5,324,411 A | 6/1994 | Ichishima et al. |
| 5,807,416 A | 9/1998 | Kemmochi et al. |
| 5,833,754 A | 11/1998 | Ito et al. |
| 5,853,523 A | 12/1998 | Machida et al. |
| 5,951,814 A | 9/1999 | Saito et al. |
| 5,993,596 A | 11/1999 | Uwai et al. |
| 6,383,333 B1 | 5/2002 | Haino et al. |
| 6,660,093 B2 * | 12/2003 | Hamaguchi et al. ......... 118/715 |
| 2002/0017242 A1 | 2/2002 | Hamaguchi et al. |

FOREIGN PATENT DOCUMENTS

| EP | 803896 A2 | 10/1997 |
| JP | 63017294 A | 1/1988 |
| JP | 64-47019 | 2/1989 |
| JP | 6-86662 | 11/1994 |
| JP | 7-53635 | 6/1995 |
| JP | 08-102443 | 4/1996 |
| JP | 9-7954 | 1/1997 |
| JP | 9-208316 | 8/1997 |
| JP | 10-209064 | 8/1998 |
| JP | 10-218664 | 8/1998 |
| JP | 11-189470 | 7/1999 |
| JP | 11-189471 | 7/1999 |
| JP | 2001-332504 | 11/2001 |
| JP | 2001-335366 | 12/2001 |
| JP | 2001-342068 | 12/2001 |
| JP | 2002-43397 | 2/2002 |

* cited by examiner

*Primary Examiner*—Roberts Culbert
(74) *Attorney, Agent, or Firm*—Oblon, Spivak, McClelland, Maier & Neustadt, P.C.

(57) ABSTRACT

Disclosed herein is an inner tube of glass-like carbon for CVD apparatus and a process for production thereof. The inner tube has its surface roughened without increase in metal impurities which cause particles. It has improved adhesion to CVD deposit film and also has a high degree of roundness. The surface roughness (on both the inner and outer surfaces) is 0.1-10 μm measured according to JIS B0601. The concentration of metal impurities (iron, copper, chromium, sodium, potassium, calcium, magnesium, and aluminum) in the surface is less than $50 \times 10^{10}$ atoms/cm$^2$.

10 Claims, 6 Drawing Sheets

FIG. 3A
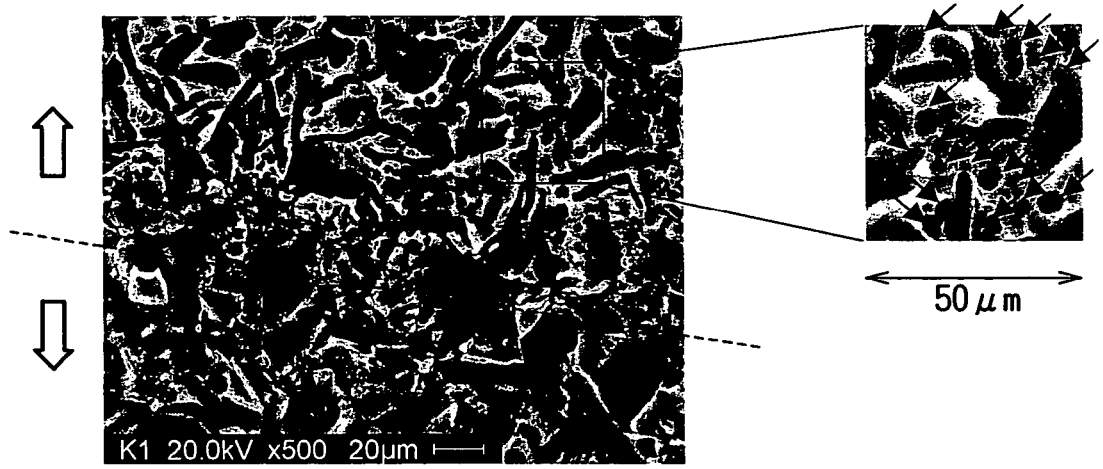
FIG. 3B
50 μm
FIG. 4A
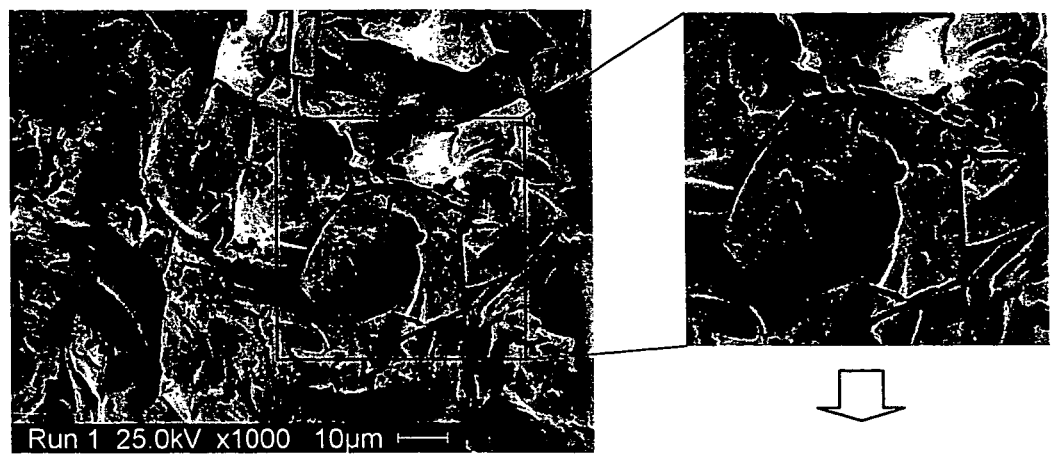
FIG. 4B
FIG. 4C

COMPONENT OF GLASS-LIKE CARBON FOR CVD APPARATUS AND PROCESS FOR PRODUCTION THEREOF

BACKGROUND OF THE INVENTION

1. Field of the Invention

The present invention relates to a component of glass-like carbon for CVD (Chemical Vapor Deposition) apparatus. Although this specification deals mainly with the inner tube for CVD apparatus, the present invention also covers various components to be arranged inside of CVD apparatus.

2. Description of the Prior Art

Production of semiconductor devices generally relies on so-called CVD process which involves gas-phase chemical reactions of reactant gases to deposit silicon, silicon nitride, etc. in the form of thin film on silicon wafers. In this process, silicon wafers are placed in an inner tube (shown in FIG. 1) for their uniform heating and controlled flow of reactant gases.

An inner tube for CVD apparatus is required to have good durability (heat resistance at 500° C. or above and corrosion resistance to reactant gases) under ordinary CVD conditions. It is also required to give off as little dust and impurity gas as possible. These requirements have conventionally been met by an inner tube made of quartz.

CVD process is based on the principle that heated reactant gases (as raw materials) decompose or react with one another to form film (such as polysilicon film and silicon nitride film) on silicon wafers. During CVD process, decomposition or reaction products of reactant gases deposit on the surface of the inner tube. The inner tube carrying such deposits (polysilicon, silicon nitride, etc.) is used repeatedly without replacement to maintain productivity. After continued use, the inner tube becomes covered with thick deposits, which eventually peel off from the inner tube to give fine particles. Such fine particles stick to silicon wafers, thereby reducing yields. Incidentally, "particles" denote particulate defects which are detected when wafers are examined by an optical tester.

One way to eliminate particles originating from deposit that peels off from the inner tube is to periodically demount and clean the inner tube to remove CVD deposit. Cleaning employs chemical solutions like hydrofluoric acid and nitric acid.

Such cleaning operation, however, reduces productivity and increases production cost. Therefore, the inner tube should permit CVD deposit to firmly adhere to it so that accumulated CVD deposit will not give rise to particles. Adhesion of CVD deposit to the inner tube is affected by the dimensional change of the inner tube which occurs when the CVD chamber is cooled and heated to unload and load wafers, respectively. The inner tube should ensure good adhesion despite its dimensional change, due to such cooling/heating cycles. Moreover, since cleaning procedure to remove CVD deposit is unavoidable, it is essential for the inner tube to have good corrosion resistance to cleaning solutions as mentioned above. Unfortunately, conventional inner tubes made of quartz are insufficient in adhesion to CVD deposit and corrosion resistance to cleaning solutions.

Under these circumstances, the present inventors previously developed a new inner tube of glass-like carbon for CVD apparatus which prevents the occurrence of particles, resists corrosion by cleaning solutions, and meets other requirements mentioned above, and they filed an application for patent (Japanese Patent Laid-open No. 3504/2001).

There is another known way to improve adhesion to CVD deposit for components of glass-like carbon or components of graphite coated with glass-like carbon. It achieves its object by blast finishing which roughens the surface of the component. (Japanese Patent Laid-open No. 342068/2001 and Japanese Patent Publication No. 86662/1994)

It is also known that the inner tube and other components for CVD apparatus may contain impurities to contaminate wafers during CVD process and thus induced contamination causes resulting devices to malfunction. Therefore, the concentration of metal impurities in the surface of components should be no more than $10 \times 10^{10}$ atoms/cm$^2$, preferably no more than $5 \times 10^{10}$ atoms/cm$^2$. In fact, a value lower than $5 \times 10^{10}$ atoms/cm$^2$ has been achieved in the case of a commercial dummy wafer made of glass-like carbon prepared under adequately controlled conditions. This dummy wafer has a mirror-finished surface with a surface roughness no higher than 0.1 μm. As with this dummy wafer, the inner tube of glass-like carbon for CVD apparatus is required to have a surface metal concentration no higher than $5 \times 10^{10}$ atoms/cm$^2$.

Incidentally, the surface metal concentration is determined in the same way as used for determination of metal on the surface of silicon wafers. The procedure starts with extracting metal from the sample with a mixed solution of 2% hydrofluoric acid and 2% hydrogen peroxide. Then the extract is analyzed by ICP-MS (inductively-coupled plasma mass spectrometry). The amount of metal thus determined is expressed in terms of the number of atoms per unit area of the sample used for extraction (atoms/cm$^2$).

By the way, a tube of glass-like carbon is obtained by preparing a resin tube and then heating it in an inert atmosphere. The heating temperature is usually higher than 800° C., preferably 1000-1200° C., more preferably 1300-2500° C. During heating for carbonization, the resin tube greatly shrinks (about 20% by volume). This shrinkage makes it difficult to obtain a completely round tube of glass-like carbon.

There was proposed a method of achieving roundness by inserting a cylindrical graphite core in a resin tube before carbonization or in a glass-like carbon tube before heat treatment at high temperatures, as disclosed in Japanese Patent Laid-open No. 189470/1999 and Japanese Patent Publication No. 189471/199. The core has an outside diameter equal to the inside diameter which the glass-like carbon tube would have as the result of the resin tube shrinking after carbonization.

However, it turned out the above-mentioned conventional method that utilizes a cylindrical core does not always give a round glass-like carbon tube.

OBJECT AND SUMMARY OF THE INVENTION

The technology disclosed in Japanese Patent Laid-open No. 332504/2001 (mentioned above) permits one to effectively prevent the occurrence of particles and to reduce the frequency of cleaning procedures. This technology employs blast finishing to roughen the surface of glass-like carbon inner tube for CVD apparatus to improve adhesion of CVD deposits, however it does not reduce particles to the required level. This is due to the fact that surface roughening increases the content of metal impurities. At present, there is a demand for an inner tube for CVD apparatus which gives off less impurities than that achieved by the above-mentioned technology.

Impurities such as particles occur when CVD deposit peels off from the surface of the inner tube as mentioned above. The present inventors, investigation revealed that the film of CVD deposit becomes so thick as to cause cracking prior to peeling. Cracks in the surface of CVD deposit film are shown in FIG. 5 (photograph taken by a scanning electron microscope).

Incidentally, CVD deposit film forms not only on the surface of an inner tube but also on the surface of various components exposed to CVD environment in CVD apparatus. Therefore, it is also necessary to suppress impurities (particles) resulting from CVD deposit film which forms on the surface of components other than inner tube.

It is known that carbonaceous materials such as glass-like carbon can be purified by heating at a high temperature (usually 2000° C. or above) in a halogen-containing atmosphere, so that halogen penetrates into carbon and vaporizes metal impurities from carbon. This process seems useful in decreasing metal impurities which may have contaminated the surface of an inner tube at the time of surface roughening.

On the other hand, the purifying process may cause dimensional distortion of the carbonaceous material. However, the inner tube for CVD apparatus should maintain sufficient roundness even after the purifying process. A possible reason why the dimensional accuracy of glass-like carbon tube is not so high is its anomalous volume change behavior. Namely, it shrinks up to about 1200° C., and then expands slightly at higher temperatures.

Incidentally, as with CVD deposit film mentioned above, metal impurities exist not only on the surface of the inner tube but also on the surface of various components in the CVD environment of CVD apparatus. Thus, it is necessary to reduce the amount of metal impurities existing on the surface of components other than inner tube, thereby suppressing the formation of particles due to metal impurities.

Accordingly, it is an object of the present invention to provide a component of glass-like carbon for CVD apparatus, which offers the following advantages, and a process for production thereof. Improved adhesion to CVD deposit. Ability to grow CVD deposit film sufficiently thick before cracking, thereby suppressing the occurrence of impurities (particles) that results from CVD deposit film peeling off. Adequately roughened surface which is made without increasing metal impurities that give rise to particles. Ability to prevent itself from giving off dust. It is another object of the present invention to provide a process for producing a glass-like carbon tube having a high degree of roundness.

The gist of the present invention resides in a component of glass-like carbon for CVD apparatus which is characterized by having a value of surface roughness ($R_a$) ranging from 0.1 to 10 µm (measured according to JIS B0601) and containing in its surface iron, copper, chromium, sodium, potassium, calcium, magnesium, and aluminum each in an amount less than $5 \times 10^{10}$ atoms/cm². The surface roughness ($R_a$) specified in the present invention is a value measured according to JIS S0601, unless otherwise mentioned.

According to the present invention, the component of glass-like carbon for CVD apparatus has a surface finished such that there exist at least five pits, 1-10 µm in diameter, in the visual field, 50×50 µm, observed under a scanning electron microscope with a magnification of ×1000, or a surface finished such that there exist elongated tiny depressions, 0.5-5 µm wide, whose total length is at least 50 µm, in the visual field, 50×50 µm, observed under a scanning electron microscope with a magnification of ×1000. Incidentally, the term "total length" means a value of the sum of the lengths of elongated tiny depressions (0.5-5 µm wide) present in the visual field.

According to the present invention, the component of glass-like carbon for CVD apparatus is any of inner tube, wafer boat, susceptor, and nozzle used for CVD apparatus.

According to the present invention, the process for producing the component of glass-like carbon for CVD apparatus is characterized by a surface roughening step and an ensuing purifying step. The surface roughening step may be a mechanical one, such as sand blasting and grinding. The purifying step may be high-temperature heat treatment in a halogen-containing atmosphere.

In the case where the component of glass-like carbon for CVD apparatus is a glass-like carbon tube, it is desirable that the mechanical surface roughening be performed on both the inner and outer surfaces and then the purifying step be carried out.

According to the present invention, the process for producing a component of glass-like carbon for CVD apparatus is characterized by mechanical surface roughening and chemical surface etching, which may be performed sequentially (in the order mentioned) or simultaneously.

The mechanical surface roughening may be accomplished by sand blasting or grinding, and the chemical surface etching may be accomplished by thermal oxidation or electrolytic oxidation.

According to the present invention, a round tube of glass-like carbon for CVD apparatus is obtained by steps of molding a raw material resin into a tube, heating the resulting resin tube at 800-1300° C., thereby converting it into a glass-like carbon tube, and heating the glass-like carbon tube at a temperature higher than 1500° C., together with a roundness correcting jig attached to the outside of the glass-like carbon tube.

BRIEF DESCRIPTION OF THE DRAWINGS

FIG. 3 is a photograph taken by a scanning electron microscope which shows tiny pits existing in the surface of the inner tube for CVD apparatus which is covered by the present invention.

FIG. 4 is a photograph taken by a scanning electron microscope which shows elongated tiny depressions existing in the surface of the inner tube for CVD apparatus which is covered by the present invention.

DESCRIPTION OF THE PREFERRED EMBODIMENTS

Figure 1:
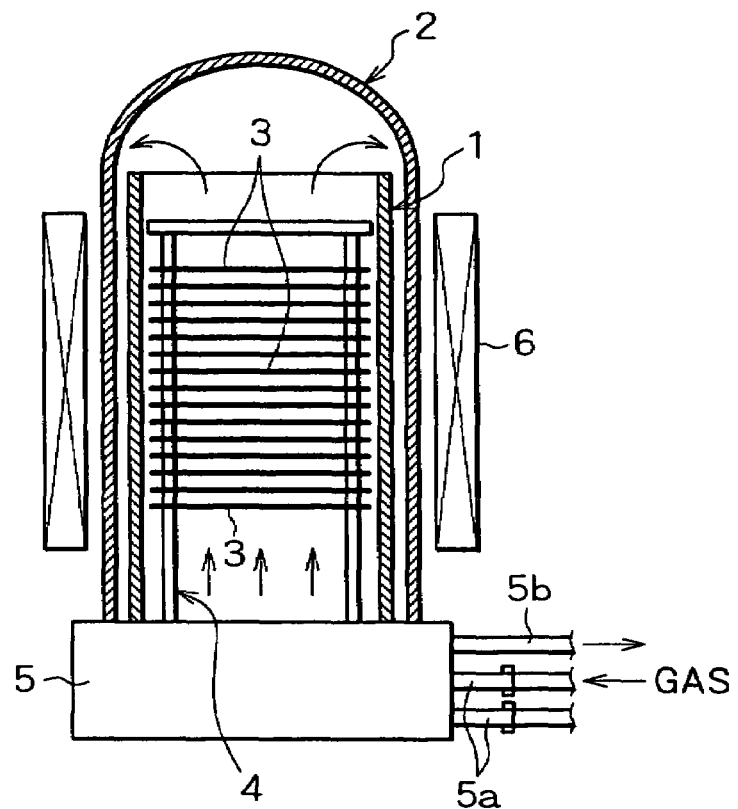
FIG. 1 is a schematic diagram illustrating a vertical low-pressure CVD apparatus, which is one of the CVD apparatus for producing semiconductor devices by CVD process.

According to the present invention, the inner tube of glass-like carbon for CVD apparatus is characterized by having its inner and outer surface roughened, so that it has improved adhesion to CVD deposit owing to the anchoring effect produced by surface irregularities. According to the present invention, the inner tube of glass-like carbon for CVD apparatus should have a value of surface roughness ($R_a$) ranging from 0.1 to 10 µm (measured according to JIS B0601).

With a value of surface roughness smaller than 0.1 µm, the inner tube of glass-like carbon does not have sufficient adhesion to CVD deposit, with the result that CVD deposit suffers microcracking before it becomes sufficiently thick. This microcracking gives off a large number of particles, thereby making it necessary to replace the inner tube frequently. With a value of surface roughness larger than 10 µm, the inner tube of glass-like carbon tends to lose its surface layer.

According to the present invention, the inner tube of glass-like carbon for CVD apparatus has its inner and outer surfaces roughened (with $R_a$ ranging from 0.1 to 10 µm) by surface roughening treatment. The surface roughening treatment should preferably be mechanical one. Particularly, sand blasting with fine powder is preferable to grinding, because it can achieve surface roughening without causing surface defects such as microcracking.

According to the present invention, the inner tube of glass-like carbon for CVD apparatus is made of glass-like carbon, so that it has a coefficient of thermal expansion in the neighborhood of $3\times10^{-6}$. This value is close to that of silicon nitride ($3.4\times10^{-6}$). This means that there is no significant dimensional change (and hence stress) due to heating between the inner tube and the silicon nitride deposit in the process of forming silicon nitride film. Such small stress contributes to improved adhesion between the inner tube and the silicon nitride deposit.

According to the present invention, the inner tube of glass-like carbon for CVD apparatus is characterizing by containing in its surface iron, copper, chromium, sodium, potassium, calcium, magnesium, and aluminum each in an amount less than $5\times10^{10}$ atoms/cm$^2$. These metals are impurities existing in the surface of the inner tube. If the concentration of any of these metals exceeds $5\times10^{10}$ atoms/cm$^2$, the inner tube tends to give off a large number of particles resulting from these metals.

The present inventors continued their research on the cause of impurities (such as particles). As the result, it was found that the inner tube of glass-like carbon for CVD apparatus is not satisfactory even though it has its inner and outer surfaces roughened to an average roughness ($R_a$) ranging from 0.1 to 10 µm (measured according to JIS B0601). To be more specific, it was found that the surface roughened by sand blasting does not sufficiently improve adhesion to CVD deposit film. It was also found that sand blasting leaves on the surface ceramics fine powder or metal fine powder (used as abrasive media) or carbon fine powder (given off by sand blasting) or stress (generated during sand blasting). They are the cause of particles falling on wafers.

The foregoing suggests that, in order to completely eliminate impurities such as particles, it is necessary to contrive a method of improving adhesion to CVD deposit film more effectively than sand blasting and a method of preventing the occurrence of dust from the inner tube itself.

The present inventors' further investigation revealed that it is possible to greatly improve adhesion between the inner tube and CVD deposit film if the above-mentioned anchoring effect is enhanced by mechanical surface roughening (such as sand blasting that produces minute surface irregularities) and ensuring chemical surface etching which forms extremely small surface irregularities with very little change in surface roughness ($R_a$). In what follows, "adhesion" occasionally implies adhesion between the inner tube surface and CVD deposit film.

The inner tube according to the present invention should preferably have extremely small surface irregularities on its surface as mentioned above. The surface irregularities are specified by (1) or (2) below so that adhesion between the inner tube and CVD deposit film is improved. Improved adhesion permits the CVD deposit film to become sufficiently thick before it suffers cracking. This prevents the occurrence of impurities such as particles.

(1) The inner tube should have on its surface at least five pits, 1-10 µm in diameter, in the visual field, 50×50 µm, observed under an SEM with a magnification of ×1000.

(2) The inner tube should have on its surface-elongated tiny depressions, 0.5-5 µm wide, whose total length is at least 50 µm, in the visual field, 50×50 µm, observed under an SEM with a magnification of ×1000.

"Pits" in (1) above denotes approximately round depressions existing on the surface of the inner tube, as shown in the SEM photograph in FIG. 3. They are indicated by arrows in FIG. 3(b). Their depth does not matter. ("Pits" may occasionally be referred to as "surface holes".)

"Elongated tiny depressions" in (2) above are what is formed after "pits" have grown. They are shown in an SEM photograph in FIG. 4. In FIG. 4(c), they are marked with a thick line for easy recognition.

The number of pits (surface holes) and the total length of elongated tiny depressions, which are defined in the present invention, are an average value of three measurements obtained from a visual field of 50×50 µm, with a magnification mentioned above.

The surface structure specified in (1) above is such that there exist at least five pits, 1-10 µm in diameter, in the visual field defined above. Such pits greatly improve adhesion between the inner tube and CVD deposit film.

Pits less than five in the visual field are not enough to produce a satisfactory anchoring effect (for adhesion between the inner tube and CVD deposit film). The number of pits should preferably be more than 10.

The number of pits in the visual field is not specifically limited; however, it should preferably be less than 100 for the reasons given below. Forming more than 100 pits requires surface chemical etching for a long time. Also, as the number of pits increases, the inner tube becomes thin without significant improvement in adhesion. Thus, increasing the number of pits unduly is not desirable from the industrial point of view.

Pits on the surface should have a diameter of 1-10 µm as specified in (1) above for the reasons given below. With a diameter smaller than 1 µm, pits do not produce the anchoring effect for improvement in adhesion to CVD deposit film. On the other hand, pits with a diameter larger than 10 µm produce an adverse effect on adhesion. Presumably, this is because each pit has a relatively smooth surface and hence a large pit does not produce the anchoring effect as desired.

Elongated tiny depressions (0.5-5 µm wide) on the surface should have a total length of at least 50 µm as specified in (2) above. If the total length is larger than 50 µm, elongated tiny depressions greatly improve adhesion between the inner tube and CVD deposit film.

If the total length is smaller than 50 µm, elongated tiny depressions do not fully improve adhesion (due to anchoring effect) between the inner tube and CVD deposit film. The total length should preferably be larger than 100 µm.

The total length of elongated tiny depressions does not have an upper limit which is specifically established for improvement in adhesion. However, elongated tiny depressions having a total length exceeding 500 μm do not produce any significant additional effect. Therefore, the total length of elongated tiny depressions should be less than 500 μm from the industrial point of view.

Elongated tiny depressions should have a width ranging from 0.5 to 5 μm as specified in (2) above for the reasons given below. Elongated tiny depressions with a width smaller than 0.5 μm are too narrow to produce the anchoring effect for improved adhesion to CVD deposit film. On the other hand, elongated tiny depressions with a width larger than 5 μm causes the inner tube surface to give off fine powder.

As mentioned above, the inner tuber of the present invention should have either or both of the surface structure specified in (1) and (2) above.

The inner tube according to the present invention is produced by the process explained in the following. A tubular form of glass-like carbon, which is used as the inner tube in the present invention, can be produced by an ordinary process, which comprises of a step of molding a raw material resin and a step of carbonizing the resulting molded object. The carbonizing step may be preceded by a preliminary heating step to avoid distortion. In the case where a thermosetting resin (mentioned later) is used as a raw material resin, the curing treatment may function as the preliminary heating step. In this way it is possible to cure the resin constituting the molded object and then carbonize the resin without serious thermal deformation.

To produce a tube of glass-like carbon, the molding step is carried out so that the raw material resin is made into a hollow cylindrical form. The molding method in this case is not specifically restricted; it includes centrifugal molding, injection molding, and extrusion molding. Of these molding methods, centrifugal molding is particularly desirable for the reasons given below. Centrifugal molding causes a molten resin to flow and cure inside a mold; therefore, it readily yields tubular products with high dimensional accuracy and it permits complete degassing (because both ends of the mold are open at the time of molding). Incidentally, the raw material resin includes any known thermosetting resins such as phenolic resin and furan resin.

Details about centrifugal molding for raw material resin are disclosed in Japanese Patent Laid-open No. 332504/2001.

The molding step to give a molded object (or resin tube) as mentioned above is followed by the carbonizing step which converts the resin tube into a glass-like carbon tube. Carbonization is usually accomplished by heating at 800-2500° C. in an inert gas atmosphere (or non-oxidizing atmosphere). The carbonizing step should be carried out in such a way that the glass-like carbon tube maintains its round cross section. This object is achieved by using a cylindrical core which is disclosed in Japanese Patent Laid-open No. 179463/2002 and Japanese Patent Application No. 347393/2001. The method of improving roundness will be mentioned later.

In the case where a thermosetting resin is used as a raw material resin, it is desirable to provide a curing step as mentioned above. The curing conditions vary from resin to resin; a phenolic resin is usually cured in the air at 180-350° C. for 10-100 hours.

The inner tube according to the present invention may be produced by a method which includes, in addition to the molding and carbonizing steps, a mechanical surface roughening step and a purifying step.

The mechanical surface roughening step is intended to form minute irregularities on the surface of the glass-like carbon tube by any known mechanical means. This step may be provided at any stage between the molding step and the carbonizing step. Mechanical surface roughening may be performed on the molded object of raw material resin before or after curing or on the glass-like carbon tube after carbonization. Incidentally, carbonization may be accomplished in two stages at about 900° C. and about 1200° C. In this case, mechanical surface roughening may be accomplished after the first stage or the second stage.

The method for mechanical surface roughening includes sand blasting and grinding. Sand blasting is preferable.

Abrasive powder for sand blasting is not specifically restricted, and any known one can be used. It includes ceramics powder (such as alumina powder and silicon carbide powder), metal powder, and glass beads. The grain size of abrasive powder and the conditions of blasting (pressure and nozzle-work distance) may be properly selected according to the surface roughness required. The abrasive powder is usually fine powder with a grain size of about #220-800.

Grinding may be accomplished by using sand paper (#150-1000). The grain size and other conditions (grinding pressure etc.) may be properly selected according to the surface roughness desired.

Mechanical surface roughening should preferably be performed on the inner and outer sides of the tube simultaneously so as to minimize the dimensional change caused by the purifying step which is carried out later. If mechanical surface roughening is performed on the inner and outer sides separately, a comparatively large stress occurs in the subsequent purifying step, and this makes it difficult to obtain an inner tube with sufficient roundness for CVD apparatus. (The reason for this is not known.)

According to another preferred embodiment, mechanical surface roughening is accompanied by or followed by chemical surface etching. Chemical surface etching is intended to partly remove the surface of the glass-like carbon tube, thereby forming minute surface irregularities. This treatment removes fine powder and damages (such as cracking) resulting from mechanical surface roughening. Therefore, it prevents the inner tube from releasing dust.

Chemical surface etching is usually carried out after mechanical surface roughening. If this order is reversed, minute irregularities formed by chemical surface etching are destroyed by mechanical surface roughening. To be more specific, chemical surface etching is performed on the glass-like carbon tube on which minute irregularities have been formed by mechanical surface roughening in any stage. However, it is possible to perform mechanical surface roughening (such as sand blasting) on the glass-like carbon tube (which has not yet undergone mechanical surface roughening) in an environment for chemical surface roughening (for example, in an environment for thermal oxidation). The result in this case is that mechanical surface roughening and chemical surface roughening are carried out simultaneously.

The treatment for chemical surface roughening includes thermal oxidation, electrolytic oxidation, and chemical etching.

Thermal oxidation is carried out in such a way that the surface of the glass-like carbon tube is oxidized to give the surface structure as defined in (1) or (2) above. It is usually accomplished by heat treatment in an oxidizing atmosphere (air or oxygen) at 600-800° C. for 0.5-10 hours.

Electrolytic oxidation is accomplished by applying electric current across the glass-like carbon tube (as an anode) and a cathode of platinum, stainless steel, or nickel, which are immersed in an electrolyte. The electrolyte is an aqueous solution of sodium hydroxide, calcium hydroxide, or ammonia. The concentration of the electrolyte (NaOH solution) is 0.1-2 M.

Electrolytic oxidation may be carried out under any unrestricted conditions so long as the resulting glass-like carbon tube has the surface structure as defined in (1) or (2) above. The degree of etching is controlled by adjusting the amount of current, which is usually 5-500 C/cm$^2$.

Chemical etching is accomplished by immersing the glass-like carbon tube in a chemical solution capable of dissolving its surface. The chemical solution is exemplified by potassium or sodium dichromate aqueous solution and chromic acid mixture.

Electrolytic oxidation is preferable because it permits the degree of etching to be controlled easily.

Incidentally, according to the present invention, the glass-like carbon tube which has undergone mechanical surface roughening alone or in combination with chemical surface etching should have a value of surface roughness ranging from 0.1 to 10 μm, preferably from 0.3 to 3 μm.

The glass-like carbon tube which has undergone surface roughening subsequently undergoes purifying treatment by heating at a high temperature in a halogen-containing gas environment. This purifying treatment reduces the content of the metal impurities which may have entered the surface of the glass-like carbon tube at the time of mechanical surface roughening. After this purifying treatment, followed by surface cleaning treatment, the concentration of each of iron, copper, chromium, sodium, potassium, calcium, magnesium, and aluminum in the surface is reduced to less than $5\times10^{10}$ atoms/cm$^2$.

The present inventors' investigation revealed that if the surface roughness of the inner tube exceeds 10 μm, the purifying treatment does not reduce the metal concentration below $5\times10^{10}$ atoms/cm$^2$, even after the surface cleaning treatment. A probable reason for this is that excessive surface roughening increases the effective surface area and hence the metal concentration per unit area of the geometrical surface of the inner tube increases. Therefore, the inner and outer surfaces of the inner tube for CVD apparatus should be roughened to a certain limit which is 10 μm, from the standpoint of reducing the metal concentration in the surface. Incidentally, after the purifying treatment, the inner tube should be washed with hydrofluoric acid, hydrochloric acid, or hydrogen peroxide in the usual way.

According to the present invention, the following method is employed to improve the roundness of the glass-like carbon tube. The process according to the present invention includes the steps of molding a raw material resin into a tube and carbonizing the resin tube by heating in an inert atmosphere at 800-1300° C. In the carbonizing step, the resin tube shrinks and vitrifies to give a glass-like carbon tube which subsequently undergoes high-temperature heat treatment. The carbonizing step should be carried out in such a way that a cylindrical core is placed inside the resin tube so that the tube remains round during heat treatment. Then, a roundness correcting jig is place around the outside of the glass-like carbon tube (which does not yet undergo high-temperature heat treatment). The glass-like carbon tube and the roundness correcting jig are heated together at a high temperature (say, 1500° C. or above) in an inert atmosphere. During heat treatment at such a high temperature, the roundness correcting jig undergoes thermal expansion and the glass-like carbon tube also undergoes thermal expansion as well as expansion due to structural change of carbon. As the result, the glass-like carbon tube, which has undergone high-temperature heat treatment, keeps a high degree of roundness, with its outer surface conforming to the inner surface of the roundness correcting jig.

Figure 6:
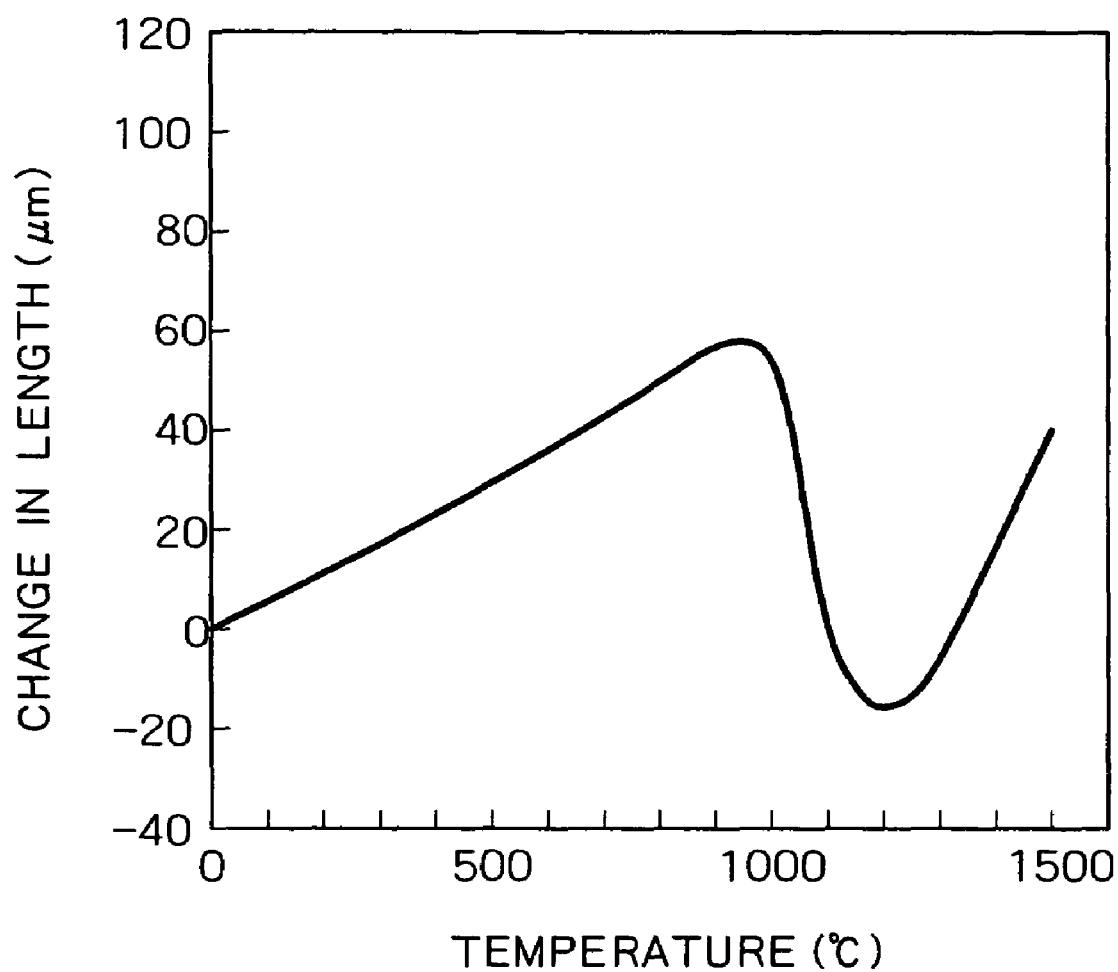
FIG. 6 is a graph showing the relation between the change in length and the temperature of a piece of glass-like carbon which have been carbonized at 900° C.

FIG. 6 is a graph showing the relation between the temperature and the change in length in the case where the glass-like carbon sample (which does not yet undergo high-temperature heat treatment) is heated. The rate of heating is 200° C./h. The glass-like carbon sample is a rectangular shape measuring 2 mm thick, 2 mm wide, 20 mm long, which has been carbonized by heating at 900° C.

As FIG. 6 shows, the molded sample of glass-like carbon expands until it is heated to about 950° C., shrinks while it is heated from 950° C. to 1200° C., and expands again while it is heated above 1200° C. The slope of the second expansion (at 1200° C. and above) is steeper than that of the first expansion (at 0-900° C.). At 0-900° C., the molded sample of glass-like carbon has a coefficient of linear expansion of about $3\times10^{-6}$ (K$^{-1}$), while at 1200-1500° C., it has a coefficient of thermal expansion of about $10\times10^{-6}$ (K$^{-1}$) The difference between the two coefficients is attributable to the change in structure that occurs at 1200-1500° C. In other words, the molded sample of glass-like carbon (which has been carbonized at 900° C. in this example) expands when it is heated from 1200° C. to 1500° C. The mechanism of expansion is not fully elucidated; probably it is caused by the change in structure of carbon.

The foregoing suggests that carbonization to give the glass-like carbon tube (which subsequently undergoes high-temperature heat treatment) should be carried out at lower than 1200° C., so that the glass-like carbon tube is heated for a long time at 1200-1500° C. in the high-temperature heat treatment. The upper limit of the carbonizing temperature should be 1300° C., with possible variation of raw material resin taken into consideration. The lower limit of the carbonizing temperature should be 800° C. at which the resin tube vitrifies. This lower limit should preferably be as close to 1200° C. as possible at which the material shrinks almost completely. (A molded object of glass-like carbon which has been heated at 900° C. shrinks at 950-1200° C.) The reason for this is that if the glass-like carbon tube greatly shrinks while it is heated through a temperature range from 950 to 1200° C., the glass-like carbon tube excessively separates from the roundness correcting jig surrounding it and this lessens the subsequent roundness correcting effect due to expansion. Incidentally, the reason why the high-temperature heat treatment should be carried out at 1500° C. or above is that it does not fully produce the roundness correcting effect due to expansion (resulting from the structural change mentioned above) if its temperature is lower than specified. The upper limit of the temperature for high-temperature heat treatment is usually 2500° C. although it varies depending on the quality and usage temperature of the glass-like carbon tube desired.

The roundness correcting jig used in the present invention should be formed from a material having good heat resistance and a coefficient of thermal expansion close to that of the glass-like carbon tube which undergoes high-temperature heat treatment. The material includes graphite, glass-like carbon, and carbon fiber, with the first being preferable.

The foregoing description is directed mostly to an inner tube of glass-like carbon for CVD apparatus. The scope of the present invention covers not only inner tubes but also other components for CVD apparatus, such as boats to hold wafers, susceptors, nozzles, etc. They are prepared from a raw material resin by molding, carbonization, surface roughening, and surface chemical etching as in the case of inner tube.

As explained above for inner tubes, these components of glass-like carbon for CVD apparatus have extremely tiny surface irregularities due to mechanical surface roughening and extremely small surface irregularities due to chemical surface etching. This surface structure produces the anchoring effect, contributing to improved adhesion to CVD deposit film. In addition, the chemical surface etching prevents the components from releasing dust from themselves. These properties are very useful in production of semiconductor devices.

EXAMPLES

The invention will be described in more detail with reference to the following examples, which are not intended to restrict the scope thereof and changes and modifications may be made without departing from the scope thereof.

Figure 2:
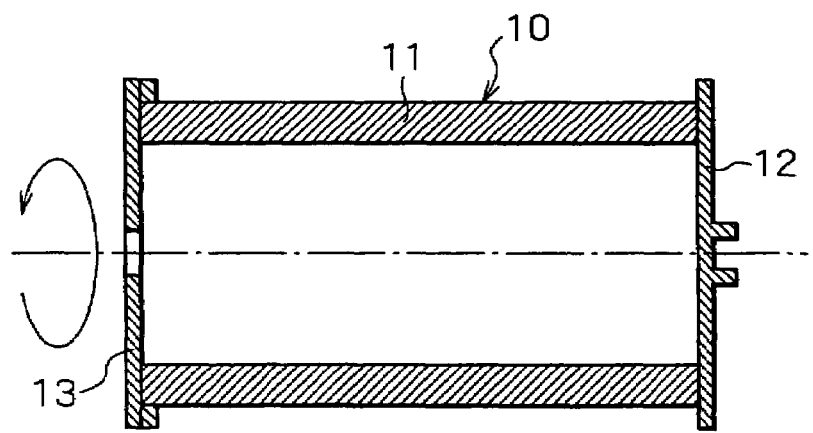
FIG. 2 is a schematic diagram illustrating the centrifugal molding which is employed in the present invention.
Figure 5:
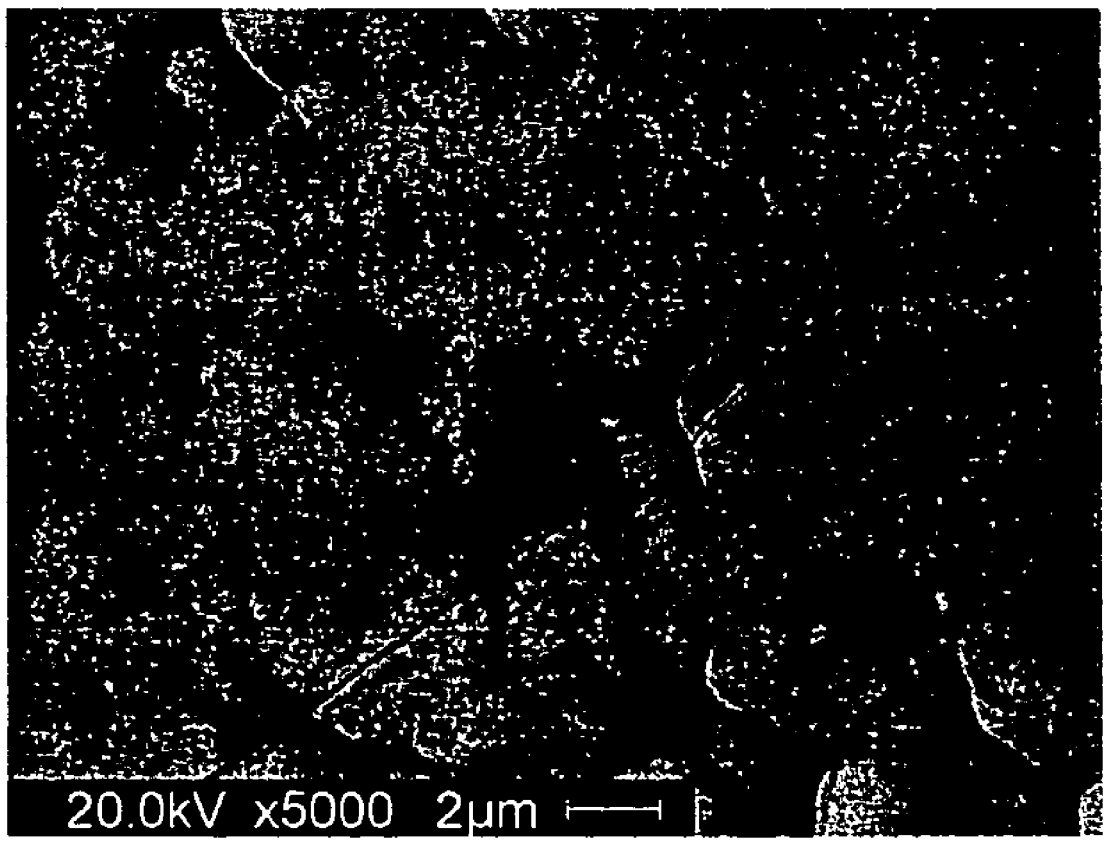
FIG. 5 is a photograph taken by a scanning electron microscope which shows cracks in the surface of nitride film formed on the surface of an inner tube for CVD apparatus.

FIG. 2 is a schematic sectional view showing an example of the mold for centrifugal molding which is used in one example of the present invention. The mold 10 for centrifugal molding consists of a mold proper 11, a bottom plate 12, and a flange stopper 13. The mold proper 11 is a cylindrical body of stainless steel, measuring 325 mm in inside diameter and 1600 mm long. It has a detachable bottom plate 12 on one end thereof, which is driven by a motor through a belt. It also has a detachable annular flange stopper 13 on the other end thereof, which prevents the thermosetting resin from leaking therefrom. This flange stopper 13 has an opening which permits reaction gases to escape. The mold proper 11 is of separable type (consisting of two sections) for easy demolding. Centrifugal molding is accomplished by charging the mold proper 11 with a thermosetting resin and then rotating the mold assembly 10 while heating it at a thermosetting temperature. Heating is accomplished by electric heaters surrounding the mold proper 11.

Example 1

Preparation of Glass-Like Carbon Tube

Raw material resin: A preferred one for glass-like carbon is a thermosetting resin such as phenolic resin and furan resin. This example employed a commercial phenolic resin "PL4804" from Gun-ei Kagaku Kogyô Co., Ltd., which had previously been vacuum-dried (below 5 wt % water content) at 65° C. for 6 hours under a reduced pressure of 10 Torr. Preparation of phenolic resin tube: A tube of phenolic resin was formed as follows by using a centrifugal molding machine equipped with the mold 10. The mold 10 was charged with the phenolic resin in a prescribed amount. The mold 10 was rotated at 600 rpm for 5 hours, with its surface temperature kept at 100° C. The mold was cooled to room temperature for demolding. Thus there was obtained a phenolic resin tube measuring 3 mm thick, 320 mm in outside diameter, and 1500 mm long. This procedure was repeated to prepare several samples.

Curing: The thus obtained phenolic resin tube was cured by heating at 300° C. for 200 hours. This curing is intended to prevent the phenolic resin tube from deforming during carbonization; therefore, it may be omitted if there is no possibility of deformation.

Carbonization: The phenolic resin tube was carbonized by heating at 1600° C. in an inert gas (nitrogen) atmosphere. Thus there was obtained a glass-like carbon tube measuring 2.5 mm thick, 268 mm in outside diameter, and 1265 mm long.

Sand blasting: The glass-like carbon tube thus obtained was exposed to a jet stream of a slurry of silicon carbide in water, which was directed to both inside and outside thereof, so that both sides are roughened simultaneously. In this process, each sample underwent roughening with silicon carbide varying in grain size, with other conditions (pressure and nozzle-surface distance) unchanged.

Electrolytic oxidation: The glass-like carbon tube with its surface roughened underwent electrolytic oxidation by immersion in an aqueous solution of sodium hydroxide (0.1 mol/L), with current applied to between the sample and a platinum sheet counter electrode (cathode). This step was followed by washing and drying in the usual way.

Purifying process: The glass-like carbon tube which had undergone electrolytic oxidation was heated (for purifying) at 2200° C. in a chlorine-containing atmosphere. The purified sample was cleaned with a mixture of 2% hydrofluoric acid and 2% hydrogen peroxide and then rinsed repeatedly with ultrapure water and dried in a clean room.

Experiment Nos. 1 to 4

Four samples (Nos. 1 to 4) of inner tube for CVD apparatus were prepared by performing the above-mentioned steps in the following order. Preparation of phenolic resin tube→Curing→Carbonization→Sand blasting→Electrolytic oxidation→Purifying.

Experiments Nos. 5 and 6

Two samples (Nos. 5 and 6) of inner tube for CVD apparatus were prepared by performing the above-mentioned steps in the following order. Preparation of phenolic resin tube→Curing→Carbonization→Purifying→Sand blasting→Electrolytic oxidation. (Sand blasting for No. 5 and No. 6 was performed under the same condition as for No. 1 and No. 2, respectively.) The procedure for Nos. 5 and 6 is the same as that for Nos. 1 and 2 except that the purifying step precedes the sand blasting and electrolytic oxidation steps.

Experiments Nos. 7 and 8

The sample No. 7 was prepared by the same procedure as for samples Nos. 1 to 4, except that the sand blasting step for surface roughening employed finer silicon carbide particles. The sample No. 8 was prepared by the same procedure as for samples Nos. 1 to 4, except that the sand blasting step for surface roughening employed coarser silicon carbide particles.

Experiment No. 9

The sample No. 9 was prepared by the same procedure as for samples Nos. 1 to 4, except that the sand blasting step was performed in two stages, the first one for inside and the second one for outside.

The thus obtained samples Nos. 1 to 9 were tested for the following items. The results are shown in Table 1.

(1) Surface roughness:

After surface roughening, the inner and outer surfaces of the inner tube for CVD apparatus were tested for surface roughness ($R_a$) specified by JIS B0601 by using a contact probe-type roughness tester (made by Rank Tailor Co., Ltd.) The surface roughness ($R_a$) is expressed in terms of an average value of measurements made in two regions (in each of the inner and outer surfaces) in which there are no scratches due to handling.

(2) Number of particles:

The number of particles released from the inner tube for CVD apparatus was counted in the following manner. The inner tube was placed in a vertical CVD apparatus which had been charged with silicon wafers. The CVD apparatus was fed with a mixed gas of dichlorosilane ($SiCl_2H_2$) and ammonia ($NH_3$) at 770° C. under reduced pressure. The step of forming silicon nitride film (150 nm thick) on each silicon wafer was repeated 100 times. After the first run and the hundredth run, the number of particles larger than 0.2 μm was counted. This procedure was accomplished by using a Surfscan (Model WH-1700, made by Topcon).

(3) Concentration of metal:

The concentration of metal in the sample was determined by ICP mass spectrometry in the following manner. A small amount of a 50:50 mixture of 2% hydrofluoric acid and 2% hydrogen peroxide is dropped onto the surface of the silicon wafer to be analyzed. The solution on the surface is allowed to stand for about 10 minutes and then recovered. The concentration of metal was analyzed by ICP-MS, and the figures are expressed in terms of the number of metal atoms per unit area of the silicon wafer. The chemicals used for analysis was ultrapure reagents made by Kanto Kagaku Co., Ltd. The apparatus used for ICP mass spectrometry was SPQ9000SE made by Seiko Instruments Co., Ltd. The apparatus was run under the condition (a) for iron, chromium, sodium, potassium, calcium, magnesium, and aluminum, and the condition (b) for copper.

(a) high-frequency output: 0.8 kW, sampling depth: 8 mm, carrier gas: 0.9 L/min, with PFA microflow nebulizer, chamber gas: 0.33 L/min.

(b) high-frequency output: 1.3 kW, sampling depth: 8 mm, carrier gas: 0.9 L/min, with PFA microflow nebulizer, chamber gas: non.

(4) Roundness:

The maximum and minimum values of the outside diameter were measured at the upper end of the inner tube for CVD apparatus. Roundness was expressed in terms of difference between the maximum outside diameter and the minimum outside diameter.

As Table 1 shows, in the case of samples Nos. 1 to 4, which have the surface roughness and the surface metal concentration within the range specified in the present invention, the number of particles was less than 60 after the first run of film forming operation and even after the hundredth run of film forming operation in which the cumulative film thickness reached 15 μm. This result is good for satisfactory device yields.

In contrast, samples Nos. 5 and 6, which underwent sand blasting and electrolytic oxidation after the purifying step, were found to have residual metal impurities which had entered the surface of the glass-like carbon tube during its surface roughening by sand blasting. Therefore, they failed to meet the requirement of surface metal concentration specified in the present invention. They gave off a large number of particles (presumably originating from metal impurities) throughout the film forming process. They were not suitable for production of semiconductor devices.

Sample No. 7, which underwent sand blasting with fine silicon carbide grits, had a value of surface roughness which is lower than that specified in the present invention. It gave off a less number of particles in the initial stage of film forming process; however, the number of particles increased as the film forming process was repeated. It did not permit the film forming process to be repeated 100 times owing to more particles than specified. These excessive particles originated from microcracking in the CVD deposit film which became thicker after the repeated film forming process. Sample No. 8, which underwent sand blasting with coarse silicon carbide grits, had a value of surface roughness which is higher than that specified in the present invention. Because of its large surface roughness (10.9 μm) exceeding the upper limit (10 μm), it had a surface metal concentration in excess of $5 \times 10^{10}$ atoms/cm$^2$ despite the purifying process. It was not used for production of semiconductor devices because it gave off a large number of particles in the first run of film forming process.

Sample No 9, which was poor in roundness (3.2 mm in terms of difference between the maximum and minimum outside diameters at the top of the tube) due to a comparatively large strain experienced in the purifying process, was not suitable for the use as an inner tube of CVD apparatus because it took a very long time to be machined into a proper dimension.

Example 2

Preparation of Glass-Like Carbon Tube

Samples of glass-like carbon tubes were prepared as follows from a commercial phenolic resin "PL4804" from Gunei

TABLE 1

| Experiment No. | Surface roughness Ra (μm) | Roundness (mm) | Concentration of metal in the surface ($\times 10^{10}$ atoms/cm$^2$) | | | | | | | | Number of particles | |
|---|---|---|---|---|---|---|---|---|---|---|---|---|
| | | | Fe | Cu | Cr | Na | K | Ca | Mg | Al | After 1$^{st}$ run | After 100$^{th}$ run |
| 1 | 0.13 | 0.9 | <0.2 | <0.2 | <0.2 | <0.2 | <0.2 | 0.9 | 0.3 | 1.1 | 38 | 73 |
| 2 | 1.3 | 0.8 | <0.2 | <0.2 | <0.2 | 0.5 | 0.4 | 0.9 | 0.5 | 2.1 | 35 | 58 |
| 3 | 2.6 | 1.2 | <0.2 | <0.2 | <0.2 | 1.6 | 1.9 | 1.8 | 1.1 | 3.1 | 39 | 48 |
| 4 | 7.9 | 0.7 | <0.2 | <0.2 | <0.2 | 0.4 | 0.5 | 2.3 | 1.6 | 1.7 | 48 | 82 |
| 5 | 0.32 | 0.8 | 7.8 | 1.4 | 1.2 | 10.6 | 11.2 | 13.5 | 16.3 | 13.9 | 336 | — |
| 6 | 1.3 | 0.8 | 5.9 | 2.4 | 1.6 | 13.7 | 10.5 | 12.1 | 11.6 | 16.2 | 415 | — |
| 7 | 0.08 | 1.1 | <0.2 | <0.2 | <0.2 | <0.2 | <0.2 | 0.3 | 1.2 | 3.8 | 46 | — |
| 8 | 10.9 | 1.4 | 6.3 | 2.1 | <0.2 | 15.8 | 9.9 | 13.4 | 16.1 | 13.8 | 442 | — |
| 9 | 2.4 | 3.2 | 0.8 | 0.3 | <0.2 | 0.3 | 0.6 | 1.9 | 2.2 | 0.9 | — | — |

Kagaku Kogyô Co., Ltd., which had previously been vacuum-dried (below 5 wt % water content) at 100° C. for 1 hour under a reduced pressure of 10 Torr. The phenolic resin was made into a tube by using a centrifugal molding machine equipped with the mold 10. Charged with 7 kg of the phenolic resin, the mold 10 was turned at 600 rpm for 10 hours, with its surface temperature kept at 120° C. so that the phenolic resin was melted. The mold was cooled to room temperature for demolding. Thus there was obtained a phenolic resin tube measuring 3 mm thick, 323 mm in outside diameter, and 1590 mm long.

The phenolic resin tube was cured by heating in the air at 250° C. for 10 hours. The cured phenolic resin tube was carbonized by heating at 1600° C. in an inert gas (nitrogen) atmosphere. Thus there was obtained a glass-like carbon tube measuring 2.5 mm thick, 268 mm in outside diameter, and 1265 mm long.

Experiment No. 1

The sample of glass-like carbon tube mentioned above was sand-blasted with #400 alumina powder for mechanical roughening of the inner and outer surfaces thereof. After sand blasting, the sample had a value of surface roughness of 0.6 μm.

Subsequently, the sample underwent electrolytic oxidation (for chemical surface etching) under the conditions shown in Table 2 in a 0.1M aqueous solution of sodium hydroxide, with current applied to between the sample and a platinum sheet counter electrode (cathode). This step was followed by washing and drying in the usual way. The thus treated sample was found to have a value of surface roughness of 0.6 μm. In other words, the chemical surface etching did not change surface roughness.

The sample which had undergone electrolytic oxidation was purified by heating at 2200° C. in a chlorine-containing gas. The purified sample was washed with a mixture of 2% hydrofluoric acid and 2% hydrogen peroxide and then rinsed with ultrapure water repeatedly. It was finally dried in a clean room. Thus there was obtained the desired inner tube for CVD apparatus. It was examined for the surface metal concentration in the same way as in Example 1. The result was no more than $5 \times 10^{10}$ atoms/cm$^2$ in all the samples.

Experiments Nos. 2 to 7

The samples underwent sand blasting in the same way as in Experiment No. 1. After sand blasting, the samples were found to have a value of surface roughness of 0.6 μm. The samples underwent electrolytic oxidation in the same way as in Experiment No. 1, except that the conditions were changed as shown in Table 2. Electrolytic oxidation was followed by washing, drying, and purifying. Thus there were obtained inner tubes for CVD apparatus. They were found to have a value of surface roughness of 0.6 μm. This indicates that the chemical surface etching (electrolytic oxidation) did not change surface roughness. They were also examined for the surface metal concentration in the same way as in Example 1. The result was no more than $5 \times 10^{10}$ atoms/cm$^2$ in all the samples.

The thus obtained inner tubes for CVD apparatus (numbered 1 to 7) were tested for the following items. The results are shown in Table 2.

(1) Surface roughness:
The samples were tested for surface roughness in the same way as in Example 1.

(2) Pits and elongated tiny depressions:
The samples were examined for their surface by observation under an SEM (×1000). Three arbitrary visual fields (50×50 μm) were photographed. The number of pits (1-10 μm in diameter) in each visual field was counted and the total length of elongated tiny depressions (0.5-5 μm wide) in each visual field was measured. Average values per visual field were calculated.

(3) Thickness at which surface cracking occurs in CVD deposit film (nitride film):
Small pieces of the inner tube were set in a vertical type low pressure CVD apparatus. The CVD apparatus was fed with a mixture gas of $NH_3$ and $SiCl_2H_2$ at 780° C. so that nitride film was formed on the surface of the inner tube. The surface of the nitride film formed on the pieces was observed under an SEM (×5000) in arbitrary ten visual fields at certain time intervals. The film thickness at which cracking began to occur was recorded.

(4) Number of particles:
The number of particles released from the inner tube for CVD apparatus was counted in the following manner. The inner tube was placed in a vertical CVD apparatus which had been charged with silicon wafers. The CVD apparatus was heated to 800° C. under reduced pressure without being fed with reactant gases. The wafers were removed from the CVD apparatus, and the number of particles on them was counted.

Incidentally, FIG. 3 is an SEM photograph showing the surface of the inner tuber for CVD apparatus which was produced under the same condition as in Sample No. 4. FIG. 3(a) consists of two parts. The part below the broken line represents the surface which was masked at the time of chemical surface etching so that it substantially underwent only mechanical surface roughening (sand blasting). The part above the broken line represents the surface which underwent mechanical surface roughening and subsequent chemical surface etching. FIG. 3(b) is a partial enlargement representing a visual field (50×50 μm) in FIG. 3(a). Arrows in FIG. 3(b) denote surface pits.

FIG. 4 is an SEM photograph showing the surface of the inner tuber for CVD apparatus which was produced under the same condition as in Sample No. 3. FIG. 4(b) is a partial enlargement representing a visual field (50×50 μm) in FIG. 4(a). Elongated depressions are apparently noticed. In FIG. 4(c) elongated depressions are marked with thick lines for easy recognition.

TABLE 2

| Experiment No. | Amount of current applied (C/cm$^2$) | Number of pits in surface | Total length of elongated depressions (μm) | Thickness at which surface cracking occurs (μm) | Number of particles (per wafer) |
|---|---|---|---|---|---|
| 1 | 10 | 4 | 55 | 10 | 115 |
| 2 | 40 | 7 | 60 | 12 | 97 |
| 3 | 80 | 10 | 260 | 18 | 53 |
| 4 | 100 | 17 | —* | 22 | 62 |
| 5 | 200 | 32 | —* | 38 | 49 |
| 6 | 0 | 0 | 0 | 0.4 | 233 |
| 7 | 5 | 3 | 20 | 1.3 | 196 |

Remarks: unmeasurable due to excessive etching.

Samples Nos. 1 to 5, which meet the requirements for the number of surface pits and the total length of elongated tiny depressions, permitted nitride film to grow to a substantial thickness before surface cracking occurs. This means that they can be used continuously without dust release until a thick nitride film is formed thereon. In addition, they gave off very few particles during operation.

By contrast, samples Nos. 6 and 7, which do not meet the requirements for the number of surface pits and the total length of elongated tiny depressions, have the following shortcomings.

Sample No. 6, which did not undergo chemical surface etching (electrolytic oxidation), caused the nitride film to crack soon after the start of operation. Cracking of nitride film necessitates replacement and cleaning of the inner tuber in the early stage and also gives off many particles during operation.

Sample No. 7, which underwent electrolytic oxidation with a reduced amount of current, has a less number of pits and a less total length of elongated depressions. Therefore, it caused the nitride film to crack soon after the start of operation. Cracking of nitride film necessitates replacement and cleaning of the inner tuber in the early stage and also gives off many particles during operation.

Experiment No. 8

The glass-like carbon tube mentioned above underwent grinding with sand paper (#240) for mechanical surface roughening on its inner and outer surfaces. This treatment gave a surface roughness of 2.1 µm.

Subsequently, the glass-like carbon tube underwent thermal oxidation in the air for 1 hour at varied temperatures shown in Table 3. This process did not change the surface roughness (2.1 µm).

The glass-like carbon tube, which had been thermally oxidized, underwent purifying treatment, followed by cleaning and drying, in the same way as in experiments Nos. 1 to 7. The resulting inner tube for CVD was tested for surface metal concentration in the same way as in Example 1. The result was less than $5 \times 10^{10}$ atoms/cm$^2$ in all the samples.

Experiments Nos. 9 to 12

Samples of glass-like carbon tubes with grinding treatment were prepared in the same way as in Experiment No. 8. They were found to have a value of surface roughness of 2.1 µm. They underwent thermal oxidation and purifying process in the same way as in Experiment No. 8, except that the temperature was changed as shown in Table 3. The resulting inner tubes for CVD apparatus were found to have a value of surface roughness of 2.1 µm. This suggests that chemical surface etching (thermal oxidation) did not change surface roughness. They were also tested for surface metal concentration in the same way as in Example 1. The result was less than $5 \times 10^{10}$ atoms/cm$^2$ in all the samples.

The thus obtained inner tubes for CVD apparatus were tested for the items in Experiments Nos. 1 to 7. The results are shown in Table 3.

TABLE 3

| Experiment No. | Temperature of thermal oxidation (° C.) | Number of pits in surface | Total length of elongated depressions (µm) | Thickness at which surface cracking occurs (µm) | Number of particles (per wafer) |
|---|---|---|---|---|---|
| 8 | 650 | 6 | 58 | 8 | 92 |
| 9 | 675 | 21 | 114 | 16 | 87 |
| 10 | 700 | 29 | —* | 26 | 89 |
| 11 | — | 0 | 0 | 0.6 | 325 |
| 12 | 600 | 5 | 42 | 1.5 | 126 |

Remarks: unmeasurable due to excessive etching.

Samples Nos. 8 to 10, which meet the requirements for the number of surface pits and the total length of elongated tiny depressions, permitted nitride film to grow to a substantial thickness before surface cracking occurs. This means that they can be used continuously without dust release until a thick nitride film is formed thereon. In addition, they gave off very few particles during operation.

By contrast, samples Nos. 11 and 12, which do not meet the requirements for the number of surface pits and the total length of elongated tiny depressions, have the following shortcomings.

Sample No. 11, which did not undergo chemical surface etching (thermal oxidation), caused the nitride film to crack soon after the start of operation. Cracking of nitride film necessitates replacement and cleaning of the inner tuber in the early stage and also gives off many particles during operation.

Sample No. 12, which underwent thermal oxidation at a lower temperature, has a less number of pits and a less total length of elongated tiny depressions. Therefore, it caused the nitride film to crack soon after the start of operation. Cracking of nitride film necessitates replacement and cleaning of the inner tuber in the early stage and also gives off many particles during operation.

Example 3

Experiment No. 1

Samples of glass-like carbon tubes were prepared as follows from a commercial phenolic resin "PL4804" from Gunei Kagaku Kogyô Co., Ltd., which had previously been dehydrated. The phenolic resin was made into a tube by using a centrifugal molding machine equipped with the mold 10. Charged with a prescribed amount of the phenolic resin, the mold 10 was rotated at 600 rpm for 24 hours, with its surface temperature kept at 100° C. The mold was cooled to room temperature for demolding. Thus there was obtained a phenolic resin tube 21 measuring 2.5 mm thick, 330 mm in outside diameter, and 1200 mm long.

Figure 7:
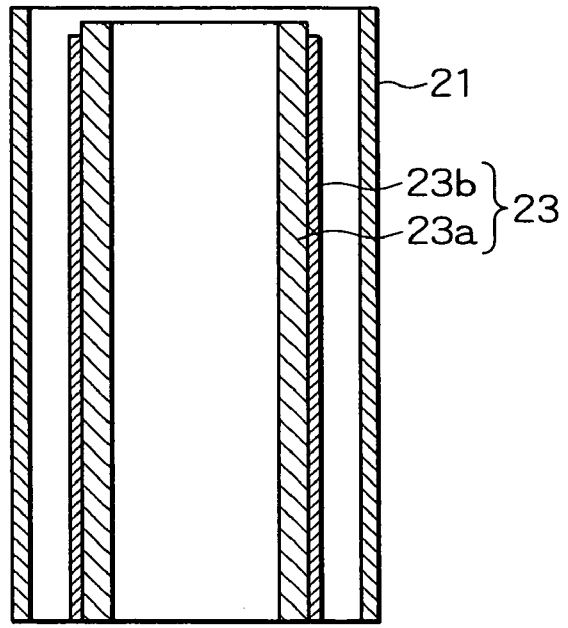
FIG. 7 is a sectional view showing how a core (with carbon fiber felt) is placed in a tube of phenolic resin.

Then, the phenolic resin tube 21, with a core 23 inserted therein as shown in FIG. 7, was carbonized at 1200° C. in the following manner. (This core is covered with carbon fiber felt.) The phenolic resin tube 21, together with the core 23, was heated in an electric furnace filled with nitrogen gas, with the temperature therein raised to 1200° C. at a rate of 2° C./h. The phenolic resin tube 21 was kept at 1200° C. for 1 hour for carbonization. The core 23 was removed. Thus there was obtained a glass-like carbon tube 22 measuring 1.9 mm thick, 249. mm in outside diameter (assuming a round tube), and 900 mm long. Incidentally, the core 23 is a graphite tube 23a, measuring 15 mm thick, 240 mm in outside diameter, and about 1200 mm long. It has one layer of carbon fiber felt (3 mm thick) 23b surrounding its outer surface, as shown in FIG. 7.

Figure 8A:
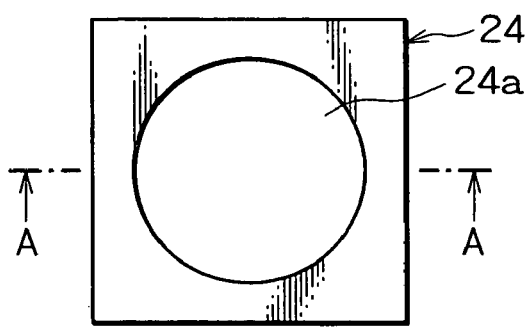
FIGS. 8(a) and 8(b) are respectively a plan view and a sectional view taken along A-A, which illustrate a roundness correcting jig used in the present invention.
Figure 8B:
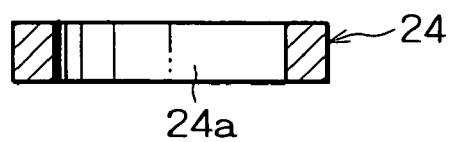

FIG. 8 shows one example of the roundness correcting jig used in the present invention. FIG. 8(a) is a plan view, and FIG. 8(b) is a sectional view taken along the line A-A. The roundness correcting jig is made of graphite. As shown in FIG. 8(a), it is a square plate measuring 300×300 mm and 30 mm thick. It has a round hole 24a, 250 mm in diameter, at its center. Into this hole 24a is inserted the glass-like carbon tube 22 mentioned above.

Figure 9:
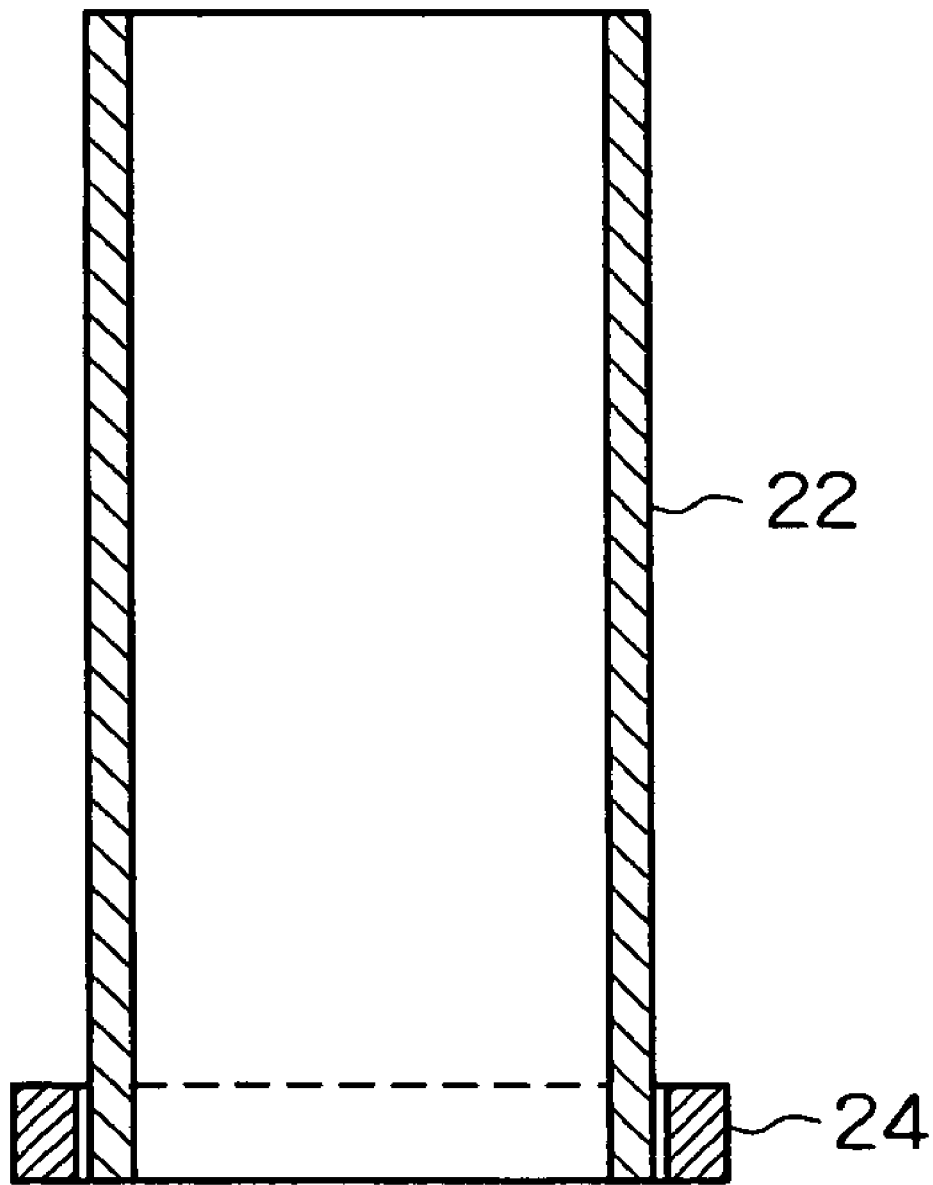
FIG. 9 is a sectional view showing a glass-like carbon tube (before high-temperature heat treatment) with a roundness correcting jig attached to its outside.

As FIG. 9 shows, the roundness correcting jig 24 was arranged at the outside of one end of the glass-like carbon tube 22, and the resulting assembly was heated in an electric furnace for high-temperature treatment in nitrogen gas. The temperature was raised to 1200° C. at a rate of 20° C./h and then to 1500° C. at a rate of 2° C./h. This temperature was kept for 1 hour. After this high-temperature treatment, the roundness correcting jig 24 was removed.

The resulting glass-like carbon tube underwent sand blasting with #400 alumina powder for mechanical surface roughening on both the inner and outer surfaces thereof. Subsequently, it underwent purifying treatment by heating at 2200° C. in a chlorine-containing gas atmosphere.

After purifying treatment, the glass-like carbon tube was examined for roundness. It was found that there is a difference of 0.3 mm between the maximum outside diameter and the minimum outside diameter measured at the end at which the roundness correcting jig was arranged. The roundness correcting jig proved useful in production of a large-scale glass-like carbon tube with a high degree of roundness. The round glass-like carbon tube does not need grinding for dimensional adjustment; it can be used as an inner tube of CVD apparatus.

Experiment No. 2

A phenolic resin tube, measuring 2.5 mm thick, 330 mm in outside diameter, and 1200 mm long, was prepared in the same way as in Experiment No. 1. It underwent heat treatment, with a core 23 arranged therein, in an electric furnace filled with nitrogen gas. The temperature was raised to 1500° C. at a rate of 2° C./h. This temperature was kept for 1 hour. The resulting glass-like carbon tube underwent mechanical surface roughening and purifying treatment in the same way as in Experiment No. 1.

The thus obtained glass-like carbon tube was found to have a difference of 1.2 mm between the maximum outside diameter and the minimum outside diameter. It is inferior in roundness to the sample in Experiment No. 1 and hence it needs to be machined before it is used as an inner tube.

Effect of the Invention

As mentioned above, the present invention provides an inner tube of glass-like carbon for CVD apparatus and a process for production thereof. The inner tube has its surface roughened without increase in metal impurities which cause particles. The roughened surface improves adhesion to the CVD deposit film. The surface roughening does not give off dust. Because of these features, the inner tube obviates the necessity of frequent cleaning to remove CVD deposits therefrom. In addition, the glass-like carbon tube has a high degree of roundness, so that it is suitable for CVD apparatus.

What is claimed is:

1. A process for producing a component of glass-like carbon, the process comprising comprising steps of:
    molding a raw material resin to produce a molded object having inner and outer surfaces,
    carbonizing the molded object,
    roughening simultaneously the inner and outer surfaces of the molded object, and
    purifying the molded object after the carbonizing step, wherein
    the roughening step comprises
        a mechanical surface roughening treatment and
        a chemical surface roughening treatment; and
    the mechanical surface roughening treatment is performed before the chemical surface roughening treatment, or
    the mechanical surface roughening treatment and the chemical surface roughening treatment are performed simultaneously.

2. The process as defined in claim 1, wherein the roughening step is performed after any step between the molding step and the carbonizing step.

3. The process as defined in claim 1, wherein the purifying step is performed at any step after the roughening step.

4. The process as defined in claim 1, wherein the roughening step comprises a mechanical surface roughening treatment.

5. The process as defined in claim 4, wherein the mechanical surface roughening treatment comprises sandblasting or grinding.

6. The process as defined in claim 1, wherein the chemical surface roughening treatment comprises thermal oxidation or electrolytic oxidation.

7. The process as defined in claim 1, wherein the component of glass-like carbon comprises a tube.

8. The process as defined in claim 1, wherein the purifying step comprises heat treatment at a temperature of 2000° C. or above in a halogen-containing gaseous atmosphere.

9. The process as defined in claim 1, wherein
    the component of glass-like carbon has a surface roughness ($R_a$) ranging from 0.1 to 10 μm (measured according to JIS B0601); and
    the component of glass-like carbon contains in its surface iron, copper, chromium, sodium, potassium, calcium, magnesium, and aluminum each in an amount less than $5 \times 10^{10}$ atoms/cm$^2$.

10. The process as defined in claim 7, wherein
    the tube has a maximum outside diameter and a minimum inside diameter; and
    a difference between the maximum outside diameter and the minimum inside diameter is 1.4 mm or less.

* * * * *